United States Patent [19]

O'Connor et al.

[11] Patent Number: 4,900,618
[45] Date of Patent: Feb. 13, 1990

[54] OXIDATION-RESISTANT METAL COATINGS

[75] Inventors: Michael T. O'Connor, Springfield, Mass.; James D. Capistran, Suffield, Conn.; James P. Brozek, Ludlow; Albert W. Morgan, Wilbraham, both of Mass.

[73] Assignee: Monsanto Company, St. Louis, Mo.

[21] Appl. No.: 64,898

[22] Filed: Jun. 19, 1987

Related U.S. Application Data

[63] Continuation-in-part of Ser. No. 928,499, Nov. 7, 1986 abandoned.

[51] Int. Cl.$^4$ .............................................. B32B 5/16
[52] U.S. Cl. .................................. 428/328; 428/335; 428/389; 428/381; 428/372; 428/544; 428/605; 428/401; 428/411.1; 428/315.5; 428/457; 174/128.1
[58] Field of Search ............... 428/544, 389, 381, 605, 428/335, 401, 372, 328, 315.5, 457, 411.1; 174/128.1

[56] References Cited

U.S. PATENT DOCUMENTS

| | | | |
|---|---|---|---|
| 3,904,783 | 9/1975 | Nara et al. | 427/54 |
| 4,082,898 | 4/1978 | Miller et al. | |
| 4,169,171 | 9/1979 | Narcus | 427/264 |
| 4,169,911 | 10/1979 | Yoshida et al. | 428/288 |
| 4,201,825 | 5/1980 | Ebneth | 428/263 |
| 4,220,678 | 9/1980 | Feldstein | |
| 4,379,184 | 4/1983 | Tsvetkov et al. | |
| 4,439,768 | 3/1984 | Ebneth et al. | 343/18 B |
| 4,481,249 | 11/1984 | Ebneth et al. | 428/288 |
| 4,497,867 | 2/1985 | Bely et al. | 428/389 |
| 4,508,780 | 4/1985 | Sirinyan et al. | 428/407 |
| 4,542,074 | 9/1985 | Sirinyan et al. | 428/450 |
| 4,554,183 | 11/1985 | Sirinyan et al. | 427/306 |
| 4,564,424 | 1/1986 | Casiat et al. | 204/30 |
| 4,568,570 | 2/1986 | Giesecke | 427/304 |

FOREIGN PATENT DOCUMENTS

1154152 6/1966 United Kingdom .

OTHER PUBLICATIONS

Abstract of Russian Patent 417,539, Podryadchik, R. S. et al.
Enthone Incorporated, "Electroless EMI Shielding . . ." (1986).
R. S. Haines, "Metallizing Nonconductive Substrates", IBM Technical Disclosure Bulletin, vol. 8, No. 9, 2/1966.

Primary Examiner—Ellis P. Robinson
Assistant Examiner—P. Ryan
Attorney, Agent, or Firm—Thomas E. Kelley; Richard H. Shear

[57] ABSTRACT

Oxidation-resistant, electrolessly deposited metal coatings, e.g. of copper, can be provided on a variety of substrates such as fibers and films. Precursor substrates have nascent or actual clusters of catalytic metal with dimensions less than 100 nanometers, e.g. about 10 nanometers. Disclosed methods can produce electrically conductive, copper-coated PET or acrylic multifilament with a resistance of less than 20 ohms/meter.

23 Claims, 7 Drawing Sheets

OXIDATION-RESISTANT METAL COATINGS

This application, which is a continuation in part of Ser. No. 928,499, filed Nov. 7, 1986, incorporated herein by reference, discloses inventions relating to electrolessly-deposited metal coatings.

More particularly, there is disclosed catalytically-active surfaces, precursors thereof, and methods of preparing and using such surfaces, e.g. in the preparation of metal-coated fibers and films and in methods of making and using such fibers and films.

BACKGROUND

Methods of preparing metal-coated articles are known. For instance, Orban in U.S. Pat. No. 4,645,573 discloses continuous processes for coating polyester filaments with copper and silver involving, as illustrated in FIG. 1A, a plurality of steps, including cleaning, wetting and etching of the filament prior to contacting with commercial palladium chloride/stannous chloride catalytic activator, followed by an acid bath, electroless copper plating, copper cyanide plating and silver cyanide plating. See also U.S. Pat. No. 4,645,574 where Orban discloses continuous processes for coating polyamide filaments which as illustrated in FIG. 1B requires the use of a preactivator. Matijevic et al. in a paper entitled: "The Characterization of the Stannous Chloride/Palladium Chloride Catalysts for Electroless Plating", Plating And Surface Finishing, Oct. 1975, p.958, indicate that colloidal palladium is necessary for catalytic activity and that solutions of palladium complexes do not act as catalysts.

In view of methods disclosed in the prior art, e.g. as illustrated by Orban and Matijevic et al., one object of this invention is to provide simpler methods for the metal coating of articles, e.g. filaments, with fewer required process steps and the common intermediate washing steps that generate waste disposal problems. It is a further object of this invention to provide such articles with an oxidation-resistant, electrolessly-deposited copper coating that requires the additional treatment of electrodeposition to provide oxidation resistance.

Others have proposed the use of binders to promote the adhesion of high levels of catalytic activator. See for instance Sirinyan, et al., who disclose in U.S. Pat. No. 4,493,861 the use of palladium complexes of polybutadiene in coating solutions comprising as least about 5.2 weight percent palladium. See also Brandt, et al., who disclose in U.S. Pat. No. 3,930,109 the application of catalytic coatings comprising polymeric binder with at least about 0.4 weight percent palladium chloride. Because of the high cost of catalytic compounds, e.g. palladium compounds, it would be desirable to be able to utilize solutions comprising lower levels of catalytic metal.

SUMMARY OF THE INVENTION

Provided herein are inventions of simple methods of preparing metal-coated articles such as fibers and films using solutions comprising low levels of catalytic compounds. Also provided are inventions of novel precursors to such articles, including articles with surfaces comprising nascent clusters of catalytic metal, surfaces comprising clusters of catalytic metal of nominal dimensions less than about 100 nanometers, and surfaces of oxidation-resistant, electrolessly-deposited metal coatings, e.g. of copper. Also provided are articles where an electrolessly-deposited metal coating provides a substrate for an outer layer, e.g. of electrodeposited metal or polymeric material. There is also disclosed inventions relating to the use of such articles, for instance electrically-conductive cable comprising copper-coated fibers according to this invention. These as well as other inventions together with preferred embodiments thereof are set forth in the following detailed description.

DETAILED DESCRIPTION OF THE INVENTION

Figure 1A:
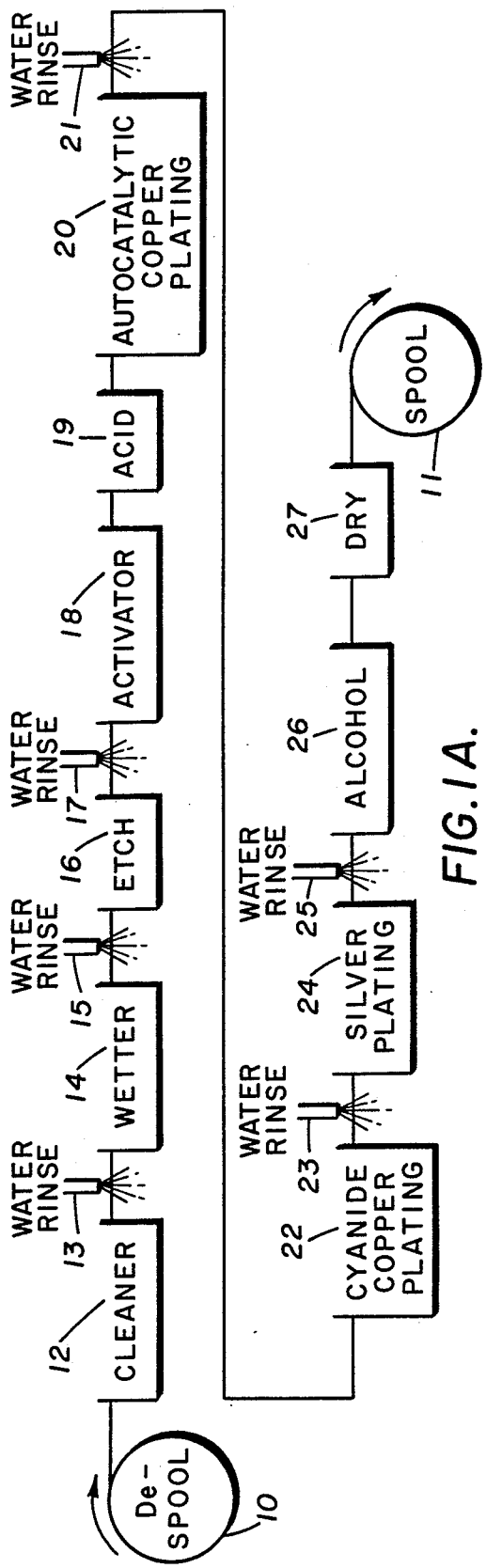
FIGS. 1A and 1B are schematic illustrations of flow charts of processes for metal coating of filaments according to the prior art, i.e. Orban as discussed above.
Figure 1B:
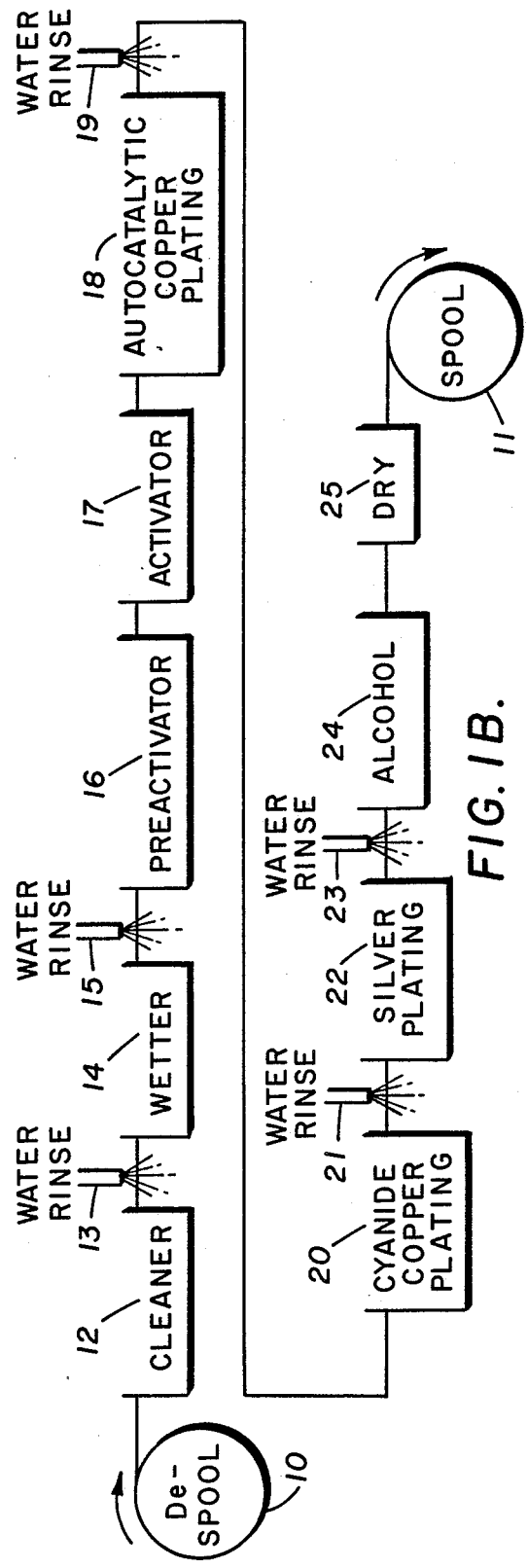

Metal-coated articles are provided by the methods of this invention using solutions comprising low levels of catalytic compounds. As used herein the term "catalytic" is intended to refer to Group 1B or Group 8 elements. In certain preferred aspects of the inventions the catalytic element will be palladium, platinum, iridium, gold, rhodium or ruthenium. In many more-preferred aspects of the inventions the catalytic element will be palladium.

Useful articles which provide substrates for such metal-coatings can comprise any of a variety of formed shapes, e.g. fibers, thin films, thick sheets, rods, spheres, extruded shapes, fabrics, containers and so forth. Such substrates can also comprise a variety of materials of construction, including organic materials such as natural or synthetic polymers or composites such as cellulose, wood, polyester, etc. or inorganic materials such as ceramics, glass, alumino-silicates, etc. In certain preferred aspects of this invention the substrates comprise films or fibers, e.g. organic or inorganic fibers which are monofilament or multifilament, e.g. a yarn or tow. Useful inorganic fibers can comprise glass, alumina, phosphate and the like; while useful organic fibers can comprise cellulose and its derivatives such as rayon, polyamides such as nylon 6, nylon 6,6 and the like, polyesters such as PET, polyolefins such as polyethylene, polypropylene and the like, acrylics such as acrylonitrile polymers and copolymers, polysulfones, polyimides, etc. Such exemplary materials for fibers can also be useful in substrates of other shapes.

Because substrate surfaces are often coated with materials such as lubricants or other processing aids which hinder the adhesion of catalyst materials, it is often necessary to initially remove such materials by washing with detergent or other cleaning solutions, e.g. comprising volatile organic solvents. A particularly useful cleaning solution for cleaning polymeric substrates has been found to comprise acidified alcohol, e.g. muriatic acid-containing methanol. If necessary the cleaner can be rinsed from the substrate, e.g. with water. Such water-wetted substrate can be directly immersed in a solution of catalytic compound. In the case of volatile cleaners such rinsing is often not necessary. For instance, cleaning solvent-wetted substrates can be dried in a warm air stream, then immersed in a solution of catalytic element.

After such optional cleaning and drying, the substrate is coated in accordance with methods of this invention with a solution of a catalytic element that will promote electroless deposition of a metal so as to provide a wetted surface of such solution. The catalyst solution-wetted surface is treated, e.g. by heating in 180° C. air for 5 minutes, to provide a surface with dry catalytic element, which can be reduced and immersed in an electroless deposition solution to provide a metal coating. In the practice of this invention such metal coating will have a grain size of up to about 250 nanometers. Such grain size characteristic can be determined as the nominal cross sectional dimension of metal particles as observed in a TEM of the surface. In this regard see the subsequent discussions of FIGS. 4–7 and Example 5.

In those cases where palladium is the preferred catalytic element, palladium can be provided as a soluble compound with chloride or nitrate anions or with ligands such as acetonitrile. An especially preferred palladium compound is palladium dichloride bisacetonitrile (PdC12BAN). It is often useful for such solutions to comprise other compounds to assist in solubilizing such catalyst compounds. In the case of palladium catalyst it is generally advantageous to provide lithium chloride (LiCl) in substantially equimolar quantities, e.g. at about one or two times the molar amount of palladium metal, to assist in providing what is believed to be a soluble palladium complex.

The catalyst compounds are provided in solutions with solvents such as tetrahydrofuran (THF), acetone, methyl ethyl ketone, methanol, methyl acetate, ethyl acetate and the like. Preferably such solvent is anhydrous and comprises THF. Such solutions preferably comprise low levels of catalyst compound. For instance such solutions will generally comprise less than about 300 parts per million (ppm) palladium, often less than about 100 ppm, or lower, say about 30–50 ppm palladium. In most cases it is desirable that useful solutions comprise more than about 3–5 ppm palladium.

The catalytic metal can be provided in reduced form on the surface by first drying the solution, e.g. by directing hot gas to the solution-wetted surface. In many cases exposing the surface for about 5–30 minutes to air heated to about 100°–200° C. has been a convenient way of providing dry catalytic material on the surface. Reduction to catalytic metal can be effected by immersing the surface in a reducing solution, e.g. a caustic/formaldehyde solution. Alternatively, the reduction of the catalytic metal can be conveniently effected in an electroless deposition solution. Such procedures for catalytic metal reduction are illustrated in the examples below.

In many cases it has been found to be useful, especially in the case of copper coatings, to heat the newly-formed metal coating, e.g. in air at 60° C., to provide enhanced oxidation resistance to the electrolessly-deposited metal coating.

In some cases it has been found to be advantageous to provide such catalyst solutions with polymer that allows preparation of articles with cataytically activatable polymeric films as disclosed in copending application Ser. No. 928,499, incorporated herein by reference. In many cases a preferred catalytically activatable polymeric film is provided from solutions which provide films of a polymer/catalytic metal complex in a molar ratio of monomer units of polymer to catalytic metal atoms of at least about 20 to 1, e.g. 30 to 1 or higher. Such solutions comprising high ratios of polymer to catalytic metal can be useful in providing metal-coated articles, e.g. organic fibers of polymers that are compatible with the polymer. Such polymers are advantageously vinyl polymers such as polyvinylchloride (PVC), polyvinylalcohol and the like or usaturated elastomer polymers such as polybutadiene. A preferred complex comprises a palladium compound and PVC or polyvinylalcohol.

Accordingly, disclosed herein is an invention of a method for providing articles with oxidation-resistant, electrolessly-deposited metal coating. Such method comprises coating a surface of an article with a film-forming solution comprising at least one polymer and at least one compound of a Group 1B or Group 8 element. After solvent removal there is provided a catalytically-activatable film comprising a complex of such polymer and compound. Such methods further comprise activating such film to catalytic activity, e.g. electroless deposition. Such activation can be effected by exposing the film to energy such as U.V. or other radiation or by heating the film. A convenient method of activating such films is to heat for about 5 minutes or so in hot air, e.g. 180° C. air. Such activated film will initially have a surface comprising nascent clusters of catalytic metal. The catalytic metal can be reduced by exposure to a reducing agent to provide a surface with catalytic metal clusters having a nominal dimension (e.g. as determined by observation of TEMs) not greater than about 100 nanometers, often not greater than about 50 nanometers. In many cases the methods of this invention can be practiced to provide clusters of a nominal dimension not greater than about 20 nanometers, say about 4–15 nanometers.

When the method of the invention is further conducted by immersing surfaces having such clusters (nascent or actual) in electroless deposition solutions, there is provided metal coatings of a grain size not greater than about 250 nanometers, e.g. about 50–150 nanometers. When such coatings are copper, they are exceptionally oxidation resistant, even when deposited in thin layers, e.g. no greater than 3 micrometers or less, say about 0.5–3 micrometers thick. That is, such coatings remain tarnish-free and bright for days, weeks or longer, e.g. months. This is surprising since electrolessly-deposited copper coatings (especially thin coatings, e.g. less than about 10 micrometers) provided in accordance with prior art practice often tarnish, i.e. blacken, within hours of removal from the electroless deposition solution.

It has been discovered that the practice of a final heat treatment after electroless deposition is particularly advantageous in imparting oxidation resistance to such metal coatings. Such treatment can be at temperatures of about 50° C., more preferably about 60° C. Such heating which can be conducted in an ambient air environment is believed to assist in removal of residual water remaining on the surface from immersion in the electroless deposition solution. The metal surface resulting from such treatment has been found to be a uniform, adherent metal coating. For instance, polymeric fibers provided with copper coatings have been found to exhibit electrical resistance as low as about 15-30 ohms per meter of length or lower, say about 3 ohms/meter.

METAL COATED FIBERS

Figure 2:
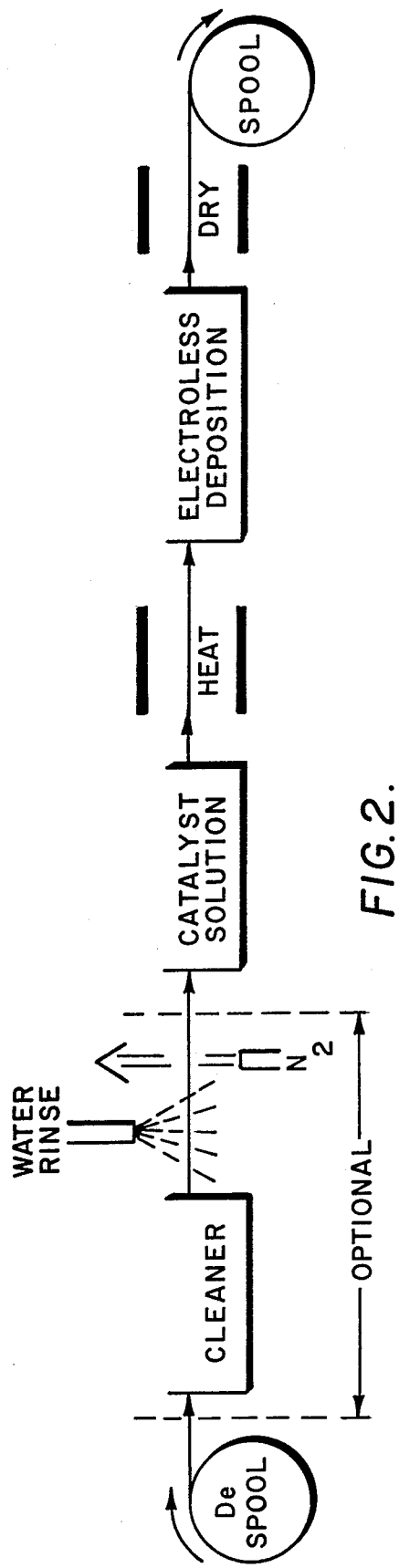
FIG. 2 is a schematic illustration of an embodiment of a process of this invention for coating fibers with metal coatings.

With reference to FIG. 2 there is shown a schematic representation of the application of one method of this invention to a continuous strand of filament. It is to be understood that the process can be practiced in stages by collecting the filaments after any of the intermediate steps in the method. Moreover the method can be applied batchwise to lengths of fiber, e.g. short lengths, say about 1-20 mm, or coils of longer lengths, say about 100 m or longer, by conveying the fibers in baskets, on spools or even in loose lengths suspended on hangers as appropriate.

When the substrate used in the disclosed inventions comprises long fibers, they are preferably handled in the cleaning step, and in subsequent steps, e.g. activating and plating, in the form of a strand. There is usually no difficulty in handling monofilament fiber to ensure complete treatment of the fiber surface. However, in the case of multifilament fiber, e.g. yarn or bundles of tow, it is generally difficult to ensure complete surface treatment unless the fiber is separated by methods known in the fiber treating field.

When the articles to be treated are multifilament fibers, it is useful to provide solutions having low solids concentrations to avoid undesirable occlusion of bunches of fibers in a polymeric matrix. Accordingly, since it is often not necessary to provide an activatable coating as described in application Ser. No. 928,499, it is sometimes useful to provide low levels of polymer, e.g. where the molar ratio of monomer units of polymer to catalytic metal atoms is about 2:1 or lower, to assist in adhesion of a uniform coating of dissolved catalyst metal on individual fibers.

In many cases it has been found to be useful to convey the catalyst solution-wetted fibers through an anhydrous environment, e.g. dry nitrogen, to an oven where the solvent and other volatile components of the solution can be removed to provide a fiber coated with finely dispersed catalytic metal compound. Such oven is preferably at a temperature of at least about 100° C., more preferably at least about 150° C. or higher. To facilitate volatilization in a reasonably short time temperatures of about 180°-190° C. have proven advantageous. After such heating, the catalyst-containing surfaces can be treated by immersion in an electroless deposition solution to simultaneously reduce the catalytic metal and deposit an occluding metal coating, e.g. of copper, nickel or the like. It has been discovered that, unlike in the prior art processes, when such heating is performed it is not necessary to provide an intermediate washing step to remove excess catalytic metal from the fiber to avoid crashing the electroless deposition solution. "Crashing" means the nonspecific and spontaneous autocatalytic metal deposition throughout the bulk of the plating solution. This is not to say that crashing does not occasionally occur in the methods of this invention. Such crashing is, however, generally avoidable when the above described heating to remove volatiles is practiced in providing fibers with a catalytic metal coating.

In accordance with the above-described methods of this invention there is provided novel metal-coated fibers, e.g. in the form of a filamentary substrate and an electrolessly-deposited metal coating, e.g. of copper, nickel, etc. Such metal coatings are in many cases occluding and advantageously substantially oxidation resistant in comparison to electrolessly deposited metal coatings of the same metal according to prior art methods. In many preferred aspects of this invention such coating comprises copper.

Such metal-coated fibers are useful as tough, lightweight electrical conductors, as shielding material for electromagnetic radiation, as antistatic materials, as antennas and so forth. The use of other metal-coated articles will be apparent to those skilled in the art.

The following disclosure is provided to illustrate specific embodiments and aspects of the inventions disclosed herein without implying any limitation to the scope thereof.

MATERIALS USED

In the following examples which illustrate embodiments of this invention the following materials are used:

Cleaning Solution: Methanol acidified with concentrated HCl prepared by adding about 2 ml of 38% HCl to 98 ml anhydrous methanol.

Catalyst Solution: A solution comprising 15% by weight $PdCl_2BAN$ stabilized with an equimolar amount of LiCl in THF is prepared by (a) drying $PdCl_2BAN$ for 48 hours at room temperature under a reduced pressure of about 21 millitorr; (b) drying LiCl at 150 C. for 48 hours; and (c) under an anhydrous nitrogen atmosphere dissolving 1.0 g $PdCl_2BAN$ and about 0.16 g LiCl in about 5.52 g dry THF.

PVC-Pd Complex Solution: A film forming solution having a PVC monomer/Pd ratio of about 60:1 prepared by (a) drying PVC powder at about 60 C for 48 hours then, under an anhydrous nitrogen atmosphere dissolving 10 g of PVC in 90 g dry THF to provide a dry 10% PVC solution; and (b) combining 20 parts by weight of the 10% PVC solution with 1 part by weight of Catalyst Solution.

Electroless Deposition Solution: A solution for electroless plating of copper prepared by combining copper sulfate pentahydrate, Rochelle salt (i.e. potassium sodium tartrate), formalin (i.e. 37% aqueous solution), sodium hydroxide (50% aqueous solution), and EDTA to provide a solution of the following analysis:

2.5 g/l copper
3 g/l formaldehyde
6 g/l hydroxide ion
22 g/l EDTA

The solution is maintained at pH 11.5-12.5 and about 38° C. in an agitated bath.

EXAMPLE 1

This example serves to illustrate the flexibility of the method of this invention in producing copper-coated polyester filaments suitable for use as an electrical conductor.

As indicated in Table 1, lengths of 1000 denier PET yarn (comprising about 50-100 multifilaments) were unwound from a spool at a linespeed of about 60 cm/min and passed over pulleys through Catalyst Solution diluted with THF in the ratio indicated in Table 1 (immersion time about 5-10 seconds), through a nitrogen purged tube to an oven at about 180 C. (heating time about 5-10 minutes), then directly to an electroless deposition solution (immersion time about 4-5 minutes). The wet copper-coated fiber was wound onto a spool which was placed in an oven at about 60 C. for about 16 hours. The electrical resistance of the dry, copper-coated fibers is reported in Table 1.

TABLE 1

Copper-Coated PET Fibers

| Ratio of Catalyst Solution to THF | Electrical Resistance (ohms/meter) |
|---|---|
| 1:100 | 98 |
| 1:1000 | 800 |
| 1:2500 | 1200 |
| 1:10,000 | very high |

EXAMPLE 2

This example serves to illustrate the application of the method of this invention to providing copper-coated acrylic fibers.

A length of 2.2 denier, multifilament acrylic fibers of a copolymer of acrylonitrile and vinyl acetate (93:7) was passed at a rate of about 20 cm/min sequentially through the following three solutions: (a) Cleaning Solution, (b) water, and (c) a 5:1 dilution with THF of PVC/Pd Complex Solution. The immersion time in each solution was about 30–45 seconds. The wetted fiber bundle was dried for about 1 minute in a nitrogen stream, then for about 20 minutes in air at 190 C. The dried fiber was immersed for about 6 minutes in Electroless Deposition Solution. Wet copper-coated fiber was wound on a spool and dried at 60 C. The dry, copper coating was oxidation resistant and exhibited an electrical resistance along the fiber bundle length of about 75 ohms/meter.

EXAMPLE 3

This Example serves to illustrate the preparation of copper-coated polyester fiber having high oxidation resistance and electrical conductivity.

The procedure of Example 1 was essentially repeated except that the yarn was immersed for about 45–50 seconds in Catalyst Solution that was diluted with THF at a ratio of 1:75, carried in a dry nitrogen stream for about 1 minute, heated for about 30 minutes in 180 C. air, immersed for about 8 minutes in Electroless Deposition Solution, and dried while being wound on a spool in air at 60 C. The copper-coated polyester fiber exhibited excellent oxidation resistance and an electrical resistance along the length of the fiber of about 15 ohms/meter.

EXAMPLE 4

This example serves to illustrate the preparation of nickel-coated polyester fiber.

A length of 1000 denier, multifilament PET yarn was immersed for about 45–50 seconds in a catalyst solution (a solution comprising 0.1% PVC with a PVC monomer unit/Pd atom ratio of about 2:1, prepared by mixing 150 parts of the 1:75 dilution Catalyst Solution used in Example 3 with 3 parts of a 5% by weight solution of PVC in THF). The catalyst solution-wetted yarn was dried for about 1 minute in a dry nitrogen stream and then for about 30 minutes in 180 C. air. The dried yarn was stored on a spool for a day. The yarn was then heated for about 5 minutes in 170 C. air, immersed for about 1 minute in a nickel electroless deposition solution to provide a yarn comprising nickel-coated PET fibers.

COMPARATIVE EXAMPLE

This example serves to illustrate the electroless deposition of copper onto polymeric substrates, i.e. ABS graft copolymer, according to the methods of the prior art.

An ABS sheet (about 6 mm thick) etched in a mixture of chromic and sulfuric acid, neutralized with HCl, activated with colloidal palladium chloride/stannous chloride, activated with a borate and electrolessly plated with copper essentially according to the method of Example 1 of U.S. Pat. No. 3,532,518, incorporated herein by reference. The immersion time in Electroless Deposition Solution was 3 minutes. The copper coating was severely tarnished to a blackened surface within a few hours. TEMs of the copper surface at magnifications of 5.32, 10.54, 20 and 40 thousand (K) are presented as FIG. 3. The white scale bar in the 40K magnification represents about 250 nanometers. Observation of the TEMs discloses that the surface comprises nodules of copper with pores of a volume substantially greater than a 250 nanometer-sided cube. Such large pores are believed to contribute to the lack of oxidation resistance of such surfaces.

EXAMPLE 5

This example serves to illustrate several aspects of inventions disclosed herein, e.g. the preparation of surfaces having nascent clusters of palladium, the reduction of such nascent clusters to reduced palladium clusters of a nominal dimension not substantially greater than about 10 nanometers, and the electroless deposition of oxidation-resistant copper onto such surfaces and the surface characterization of such copper coatings.

Figure 4:
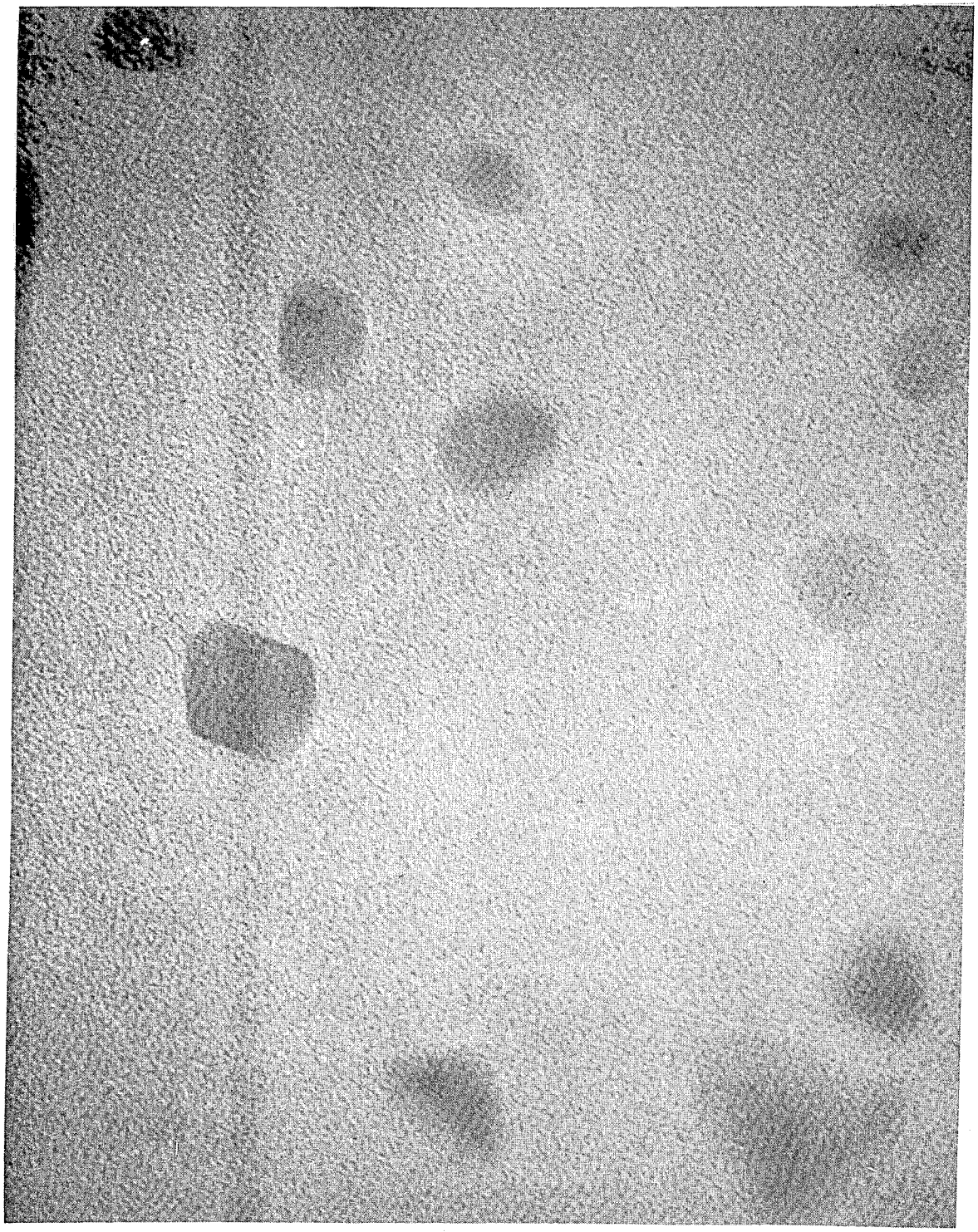
FIGS. 4–7 are TeMs of surfaces prepared according to this invention as set forth in Example 5, with FIG. 4 showing a polymeric surface having palladium clusters of a nominal dimension of about 10 nanometers and FIGS. 5–7 showing oxidation-resistant, electrolessly-deposited copper.

An ABS sheet (about 6 mm thick) was coated with PVC/Pd Complex Solution, the coating was dried to form a polymeric film. The film was heated for about 5 minutes in 180° C. air to provide the sheet with a polymeric surface having nascent clusters of palladium of a nominal dimension not substantially greater than about 10 nanometers. Analysis by ESCA indicated the presence of reduced or ionic palladium on the surface; the presence of reduced palladium on the surface was not indicated by electron microscopy. Subsequent reduction by immersion in a solution of formaldehyde and sodium hydroxide, e.g. Electroless Deposition Solution prepared without copper sulfate, produces a surface comprising reduced palladium clusters. FIG. 4 is a TEM of such a surface. The cluster closest to the center of FIG. 4 has a diagonal measurement (nominal dimension) of about 10 nanometers. X-ray crystallography of a TEM-isolated cluster indicated non-oxidized palladium crystal of octahedral morphology, (111) Miller indices, and crossed lattice planes at 0.225 nanometer spacing.

Another ABS sheet having a polymeric surface with nascent palladium clusters, prepared as aboveindicated in this example, was immersed for about 3 minutes in an Electroless Deposition Solution to simultaneously reduce the palladium and provide a copper coating which was substantially oxidation resistant. TEMs of the copper coating are presented as FIG. 5.

Another ABS sheet was coated with PVC/Pd Complex Solution to provide the sheet with a polymeric film coating. The dried polymeric film was stripped from the ABS sheet leaving a thin residue coating. The ABS sheet was heated for about 5 minutes in 180 C. air to provide the sheet with a coating having nascent clusters of palladium. The sheet was immersed in Electroless Deposition Solution for about 3 minutes to provide the sheet with a copper coating which was substantially oxidation resistant. TEMs of the copper coatings are presented as FIG. 6.

A glass slide was coated with PVC/Pd Complex Solution to provide the glass with a polymeric film coating. The dried polymeric film was heated for about 5 minutes in 180 C. air, then immersed for about 3 minutes in Electroless Deposition Solution to provide a laminate comprising a glass substrate, an intermediate polymeric layer and an oxidation-resistant, electrolessly-deposited copper layer. TEMs of the copper surface are presented as FIG. 7.

Figure 3:
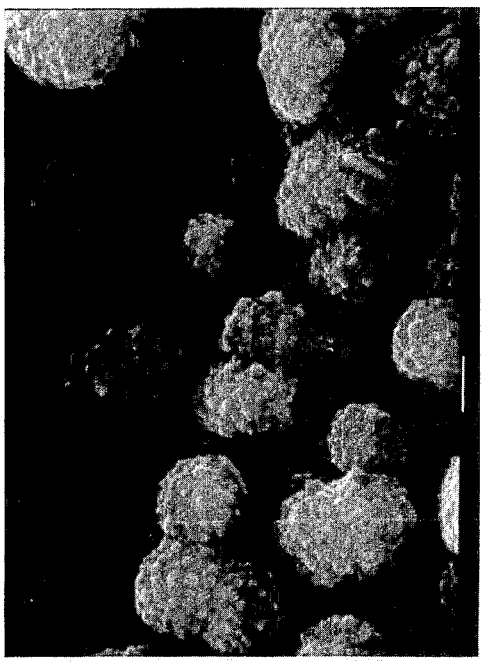
FIGS. 3 is a transmission electron micrograph (TEM) of an electrolessly-deposited copper coating prepared according to prior art procedures set forth in Comparative Example 5.
Figure 3:
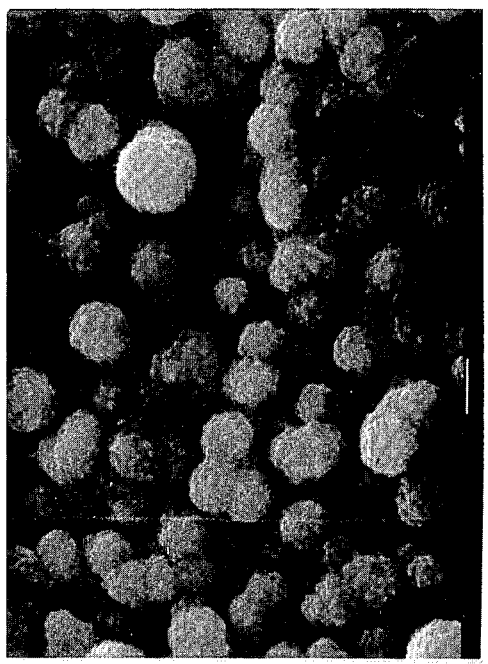
Figure 3:
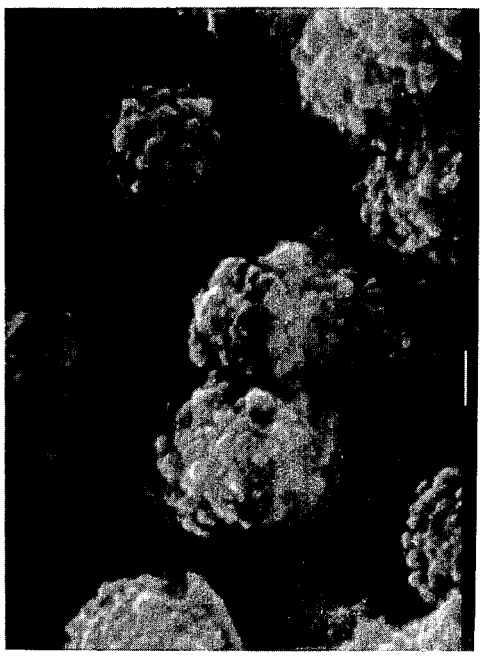
Figure 3:
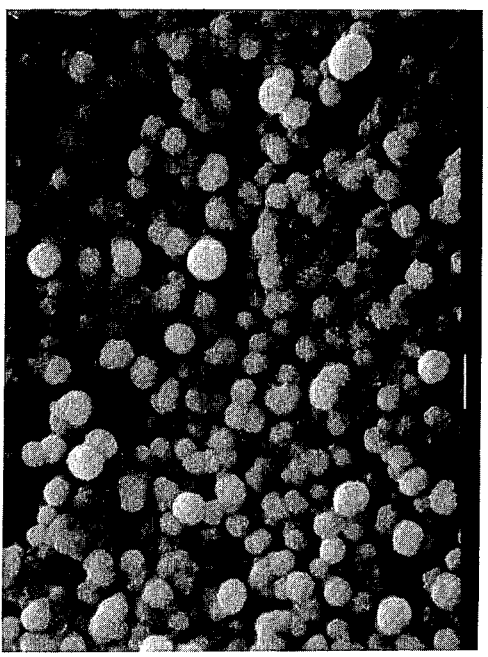
Figure 5:
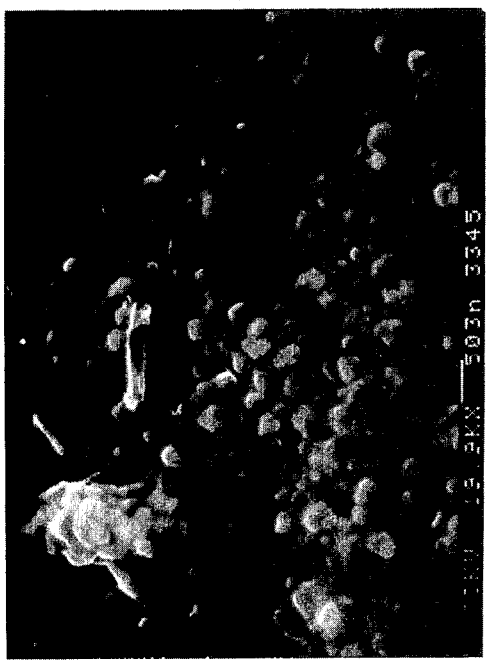
Figure 5:
Figure 5:
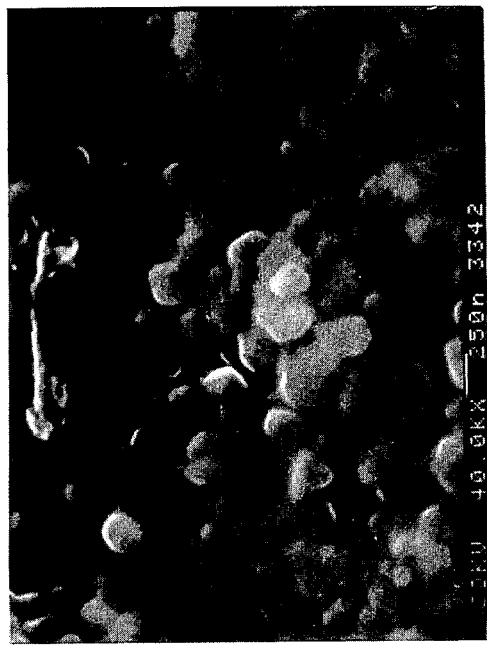
Figure 5:
Figure 6:
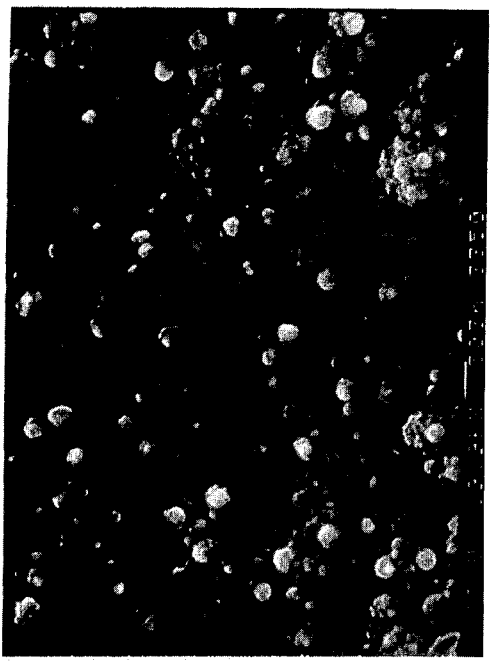
Figure 6:
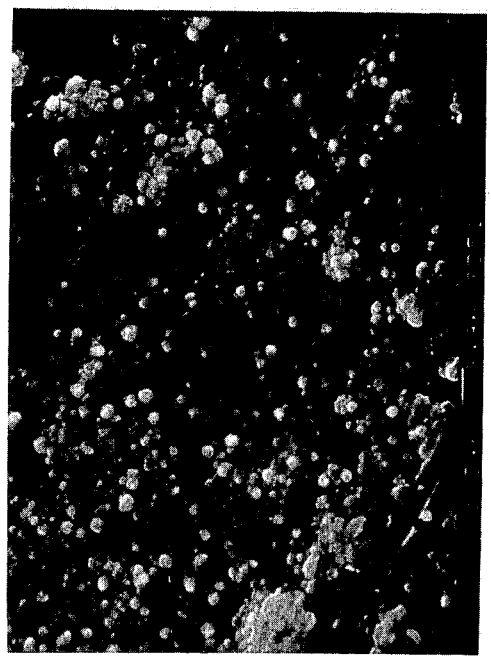
Figure 6:
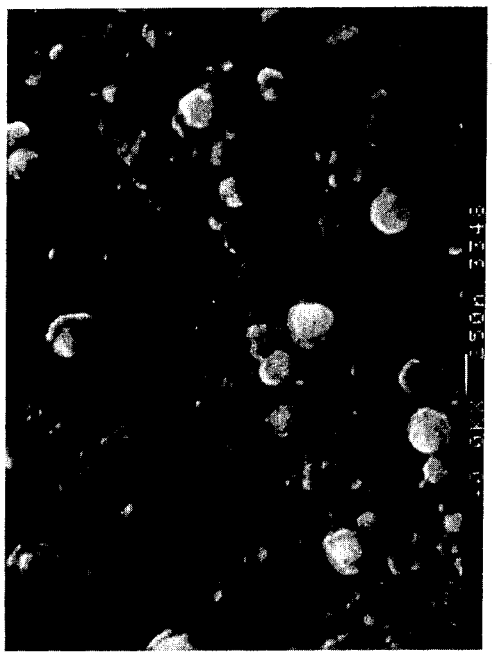
Figure 6:
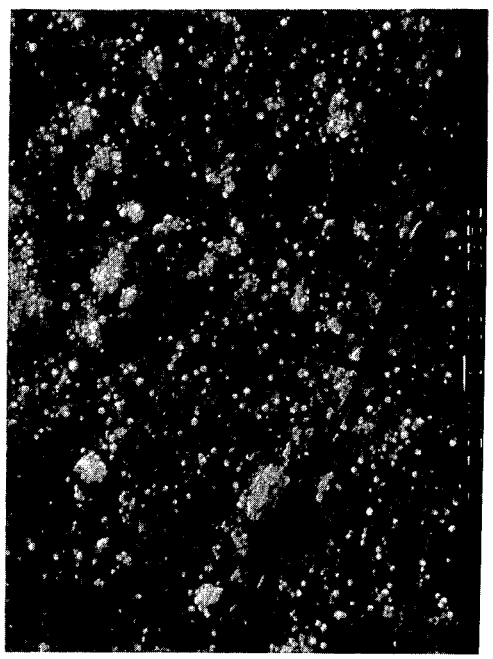
Figure 7:
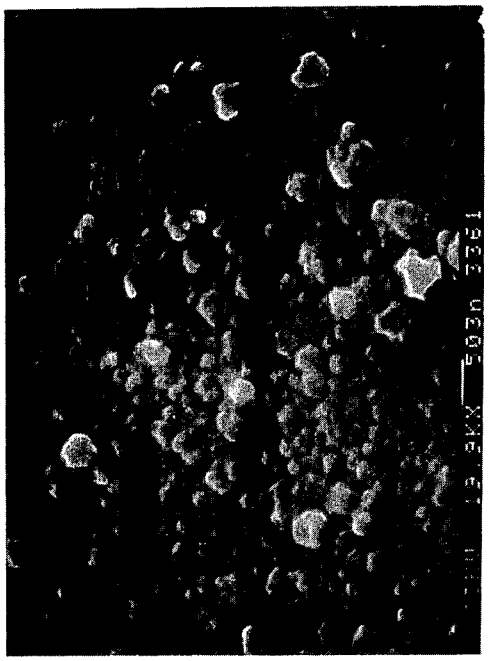
Figure 7:
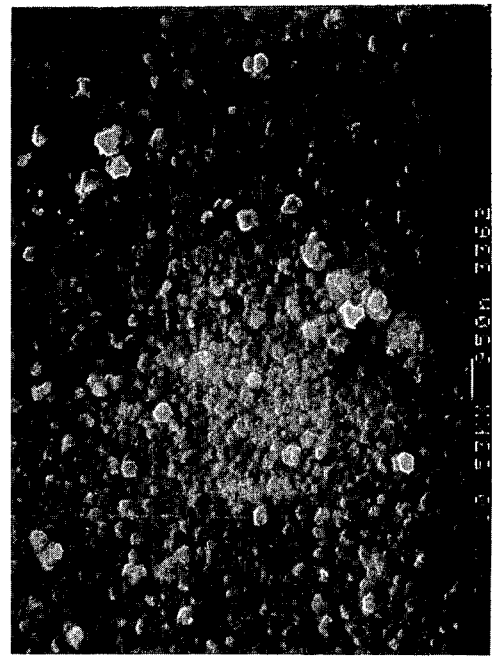
Figure 7:
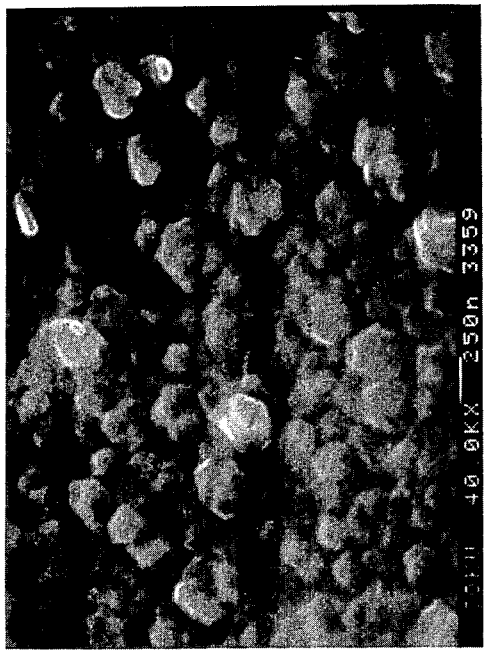
Figure 7:
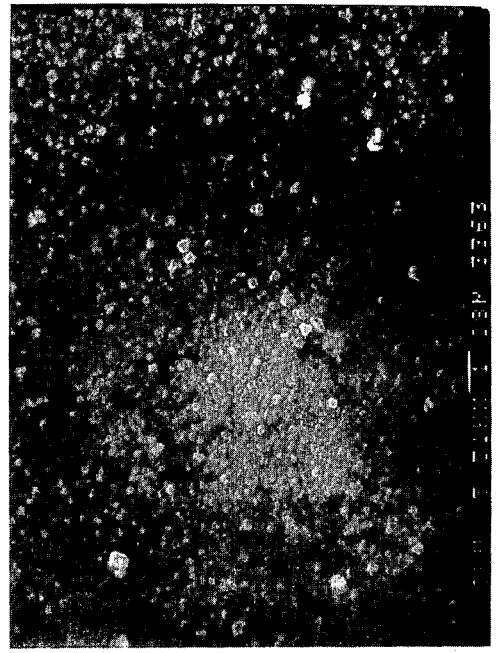

The TEMs of FIGS. 5,6 and 7 show the surface at nominal magnifications of 5, 10, 20 and 40K. The white scale bar in the 40K magnification represents 250 nanometers. Observation of the TEMs discloses substantially smooth surfaces as compared to the prior art, e.g. as illustrated by FIG. 3, and substantially no pores of a volume greater than a 250 nanometer cube. Such smooth surfaces as manifested by a lack of pores common to the prior art is believed to contribute to the high degree of oxidation resistance, i.e. a lack of tarnish over a long period of time, e.g. days, weeks and often months or longer.

While specific embodiments of the inventions have been described, it should be apparent to those skilled in the art that various modifications thereof can be made without departing from the true spirit and scope of the invention. Accordingly, it is intended that the following claims cover all such modifications within the full inventive concept.

What is claimed is:

1. An article having a coating comprising an oxidatively-resistant layer of electrolessly-deposited copper, wherein such copper remains tarnish free and bright for at least one day, has a substantially smooth surface and substantially no pores of a volume greater than a 250 nanometer sided cube.

2. A laminate according to claim 1 wherein said copper is not greater than 3 micrometers in thickness.

3. An article according to claim 1 in the form of a metal-coated fiber.

4. An electrically-conductive cable comprising a plurality of fibers according to claim 3.

5. An article according to claim 1 wherein said layer is electrolessly deposited on a polymer layer comprising clusters of a Group 1B or Group 8 metal.

6. An article according to claim 1 wherein said clusters are palladium.

7. An article according to claim 6 wherein said clusters comprise palladium crystals of octahedral morphorlogy.

8. An article according to claim 5 wherein said clusters have a nominal cross-sectional dimension of not greater than about 100 nanometers.

9. An article according to claim 8 wherein said clusters have a nominal cross-sectional dimension of not greater than about 50 nanometers.

10. An article according to claim 9 wherein said clusters have a nominal cross-sectional dimension of not greater than about 20 nanometers.

11. An article according to claim 10 wherein said clusters have a nominal cross-sectional dimension of not greater than about 10 nanometers.

12. An article according to claim 1 comprising at least one other outer layer.

13. An article according to claim 12 wherein said outer layer comprises metal.

14. An article according to claim 13 wherein said outer layer comprises electrolytically deposited metal.

15. An article according to claim 12 wherein said outer layer comprises polymer.

16. An article comprising metal having a substantially smooth surface and substantially no pores of a volume greater than a 250 nanometer sided cube electrolessly deposited on a polymer surface having clusters of a Group 1B or Group 8 element, wherein said clusters have a nominal dimension of not greater than about 100 nanometers and wherein said clusters are provided by
    (a) exposing a catalytically inert polymeric surface which is substantially devoid of metal to energy whereby nascent clusters form by migration of metal ions to said surface, and
    (b) reducing said nascent clusters.

17. An article having on at least a part of its surface a coating comprising oxidatively-resistant electrolessly deposited copper having a substantially smooth surface and substantially no pores of a volume greater than a 250 nanometer sided cube.

18. An article according to claim 17 wherein said copper is less than about 50 nanometers thick.

19. An article according to claim 18 wherein said copper is less than about 20 nanometers thick.

20. A fiber coated with oxidatively-resistant electrolessly deposited copper having a substantially smooth surface and substantially no pores of a volume greater than a 250 nanometer sided cube.

21. A fiber according to claim 20 comprising at least one other outer layer.

22. A fiber according to claim 21 wherein said outer layer is electrolytically deposited metal.

23. A fiber according to claim 21 wherein said outer layer is polymeric.

* * * * *

UNITED STATES PATENT AND TRADEMARK OFFICE
CERTIFICATE OF CORRECTION

PATENT NO. : 4,900,618
DATED : 2/13/90
INVENTOR(S) : Michael T. O'Connor et al.

It is certified that error appears in the above-identified patent and that said Letters Patent is hereby corrected as shown below:

Col. 1, line 42 "requires", should read --does not require--;

line 49, "as", should read --at--.

Col. 2, line 23, "TeMs", should read --TEMS--.

Col. 3, line 30, the formula "(PdCl2BAN)", should read --$(PDCl_2BAN)$--.

Signed and Sealed this

Fourth Day of June, 1991

Attest:

HARRY F. MANBECK, JR.

Attesting Officer

Commissioner of Patents and Trademarks